US011757438B2

(12) United States Patent
Nicholls

(10) Patent No.: US 11,757,438 B2
(45) Date of Patent: Sep. 12, 2023

(54) TRANSPOSED DELAY LINE OSCILLATOR AND METHOD

(71) Applicant: Nanowave Technologies Inc., Etobicoke (CA)

(72) Inventor: Charles William Tremlett Nicholls, Nepean (CA)

(73) Assignee: Nanowave Technologies Inc., Etobicoke (CA)

( * ) Notice: Subject to any disclaimer, the term of this patent is extended or adjusted under 35 U.S.C. 154(b) by 19 days.

(21) Appl. No.: 17/634,590

(22) PCT Filed: Aug. 13, 2020

(86) PCT No.: PCT/CA2020/051107
§ 371 (c)(1),
(2) Date: Feb. 11, 2022

(87) PCT Pub. No.: WO2021/026655
PCT Pub. Date: Feb. 18, 2021

(65) Prior Publication Data
US 2022/0329239 A1 Oct. 13, 2022
US 2023/0231545 A9 Jul. 20, 2023

Related U.S. Application Data

(60) Provisional application No. 62/886,010, filed on Aug. 13, 2019.

(51) Int. Cl.
*H03K 5/1252* (2006.01)
*H03D 7/00* (2006.01)
(Continued)

(52) U.S. Cl.
CPC .......... *H03K 5/1252* (2013.01); *H03B 19/00* (2013.01); *H03B 21/00* (2013.01); *H03D 7/00* (2013.01);
(Continued)

(58) Field of Classification Search
CPC . H03B 17/00; H03B 9/00; H03B 9/12; H03B 9/14; H03B 2200/009; H03B 19/00;
(Continued)

(56) References Cited

U.S. PATENT DOCUMENTS 4,262,361 A * 4/1981 Hauer .................. H04B 1/28
455/113
5,059,972 A 10/1991 Heieren
(Continued)

FOREIGN PATENT DOCUMENTS

CA 2739959 A1 11/2011
DE 102007028372 A1 * 12/2008 ........... H03B 5/1864

OTHER PUBLICATIONS

Hosseini et al., "Theoretical Investigation of an Ultra-low Phase Noise Microwave Oscillator Based on an if Crystal Resonator-amplifier and a Microwave Photonic Frequency Transposer," Journal of the Optical Society of America B, Jun. 2018, vol. 35(6), pp. 1422-1432.
(Continued)

*Primary Examiner* — Ryan Johnson
(74) *Attorney, Agent, or Firm* — Borden Ladner Gervais LLP

(57) ABSTRACT

A transposed delay line oscillator including a mode selection filter and a transposed delay line is provided. An output of the transposed delay line is coupled to an input of the mode selection filter to establish an oscillator loop. Based on the transposed delay line output, the mode selection filter generates a mode selection signal including an isolated oscillatory mode, in a Radio Frequency (RF) band. The transposed delay line receives the mode selection signal for transposition to an intermediate frequency of an intermediate frequency (IF) delay line. The IF delay line includes a delay filter and a phase noise suppression loop configured to suppress de-correlated transposition phase noise resulting
(Continued)

from a delay of the delay filter. Suppression of phase noise in the IF delay line enables cancellation of transposition phase noise when transposing the IF delay line output to the RF band.

20 Claims, 15 Drawing Sheets

(51) Int. Cl.
  *H03K 5/14* (2014.01)
  *H03D 7/16* (2006.01)
  *H03D 7/18* (2006.01)
  *H03B 21/00* (2006.01)
  *H03B 19/00* (2006.01)
  *H03B 17/00* (2006.01)

(52) U.S. Cl.
  CPC ............... *H03D 7/161* (2013.01); *H03D 7/18* (2013.01); *H03K 5/14* (2013.01); *H03B 17/00* (2013.01)

(58) Field of Classification Search
  CPC . H03B 21/00; H03B 5/00; H03L 7/00; H03D 7/00; H03D 7/18; H03D 7/161
  See application file for complete search history.

(56) References Cited

U.S. PATENT DOCUMENTS

| | | |
|---|---|---|
| 5,661,439 A | 8/1997 | Watkins et al. |
| 2015/0326202 A1* | 11/2015 | Nicholls .................. H04B 1/28 327/553 |
| 2016/0226442 A1 | 8/2016 | Valdes-Garcia et al. |
| 2018/0248518 A1* | 8/2018 | Nicholls .................. G02F 2/02 |

OTHER PUBLICATIONS

International Patent Application No. PCT/CA2020/051107, International Search Report and Written Opinion dated Nov. 20, 2020.
International Patent Application No. PCT/CA2020/051107, International Preliminary Report on Patentability dated Feb. 8, 2022.

* cited by examiner

TRANSPOSED DELAY LINE OSCILLATOR AND METHOD

CROSS REFERENCE TO RELATED APPLICATIONS

The present disclosure is related to co-pending patent application entitled "DELAY DEVICE AND METHOD OF EMULATING RADAR SIGNAL PROPAGATION DELAYS" filed of even date herewith, which is incorporated herein by reference.

FIELD

The present disclosure relates to RADAR (Radio Detection and Ranging) systems, including but not limited to improving RADAR sensitivity with transposed delay lines.

BACKGROUND

Oscillators having low phase noise and a wide tuning bandwidth are desirable for radio equipment including telecommunications, RADAR, and electromagnetic sensor systems and associated test and measurement equipment. Phase noise represents the random fluctuation in signal phase with time, and results in a reduction in detection sensitivity of the system in which the oscillator is used. In the case of RADAR, reducing phase noise improves system sensitivity resulting in increased operational range or reduction in minimum detectable target scattering cross section. In the case of a telecommunications system, reducing phase noise results in increased maximum data rate, reduction in the bit error rate, and an increase in the number of channels that can be placed in a specified bandwidth by virtue of the reduction in the guard band requirements. In both systems reduction in phase noise also improves the immunity of the system to interference or jamming signals.

In the specific case of RADAR systems, phase noise results in a spreading of the transmitted RADAR pulse signal in frequency. Such spectral broadening leads to increase in ground clutter, causing a degradation in the minimum detectable signal level for the RADAR system. As the phase noise is reduced, ground clutter suppression is increased.

Conventional RADAR systems employ low phase noise microwave oscillators. Recent advances in oscillator technology have led to the use of an optical delay line oscillator for improving phase noise. Typically, the optical delay line consists of between 1 km and 15 km of a single mode optical fiber wound on a spool for achieving higher quality factors resulting in oscillator phase noise reduction. The long fiber length however results in a large physical size, which increases susceptibility to thermal and mechanical perturbations and also limits the range of applicability to rack mounted equipment. In addition, while increased fiber length achieves lower phase noise and higher quality Q factors, the spacing between electro-optical modes decreases, making selection of a single oscillation mode more problematic.

Improvements in RADAR systems, signal sources for RADAR systems, and related delay lines are desirable.

BRIEF DESCRIPTION OF THE DRAWINGS

Embodiments of the present disclosure will now be described, by way of example only, with reference to the attached Figures.

BRIEF SUMMARY

Figure 1:
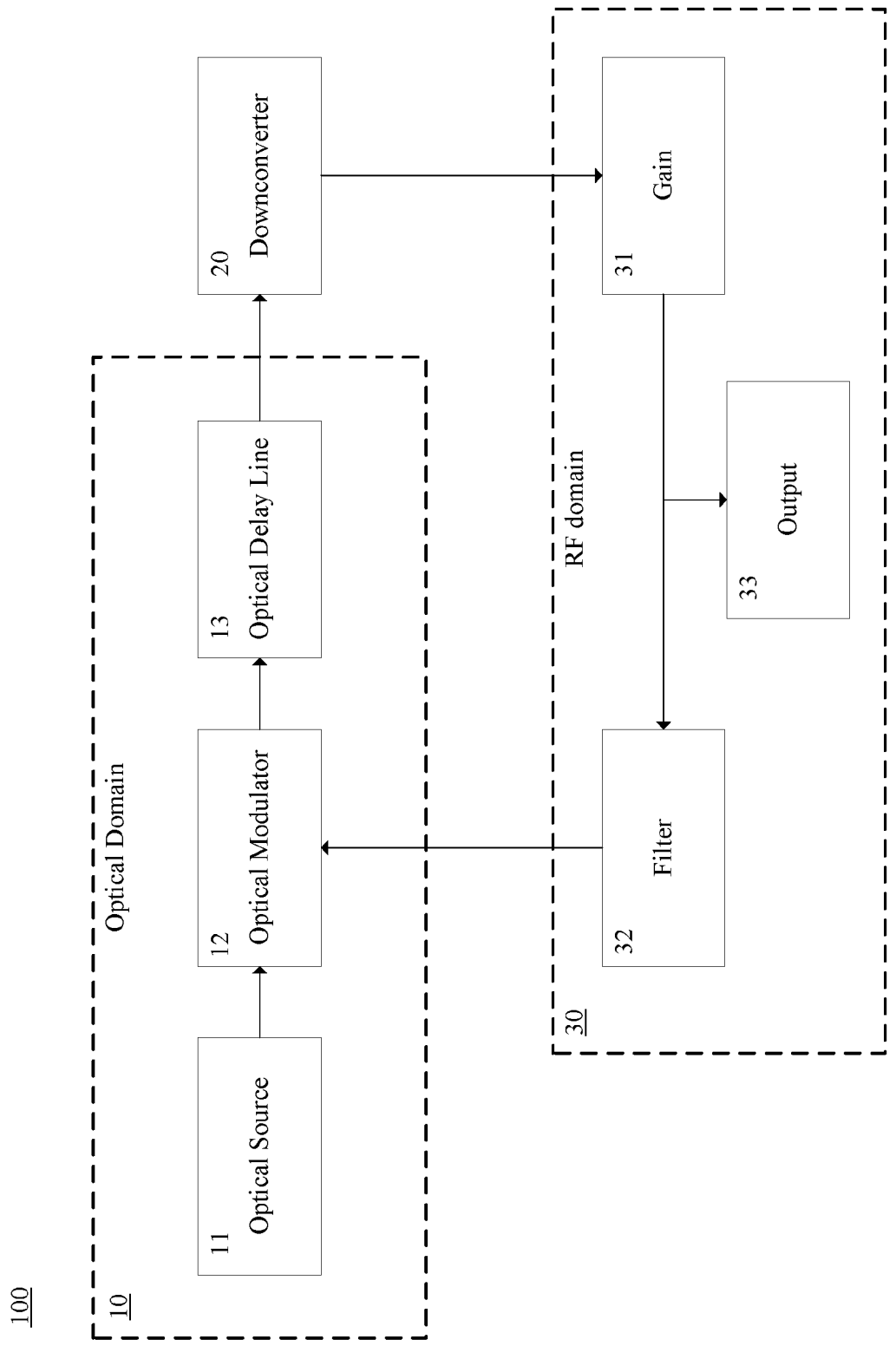
FIG. 1 illustrates a prior art optoelectronic oscillator having an optical delay line for improving phase noise.

The following presents a simplified summary of the disclosure in order to provide a basic understanding of some aspects of the disclosure. It is not intended to identify key or critical elements of the embodiments or to delineate the scope of the embodiments. The following summary merely presents some concepts of the disclosure in a simplified form as a prelude to the more detailed description provided below.

In an aspect, a transposed delay line oscillator comprising a mode selection filter configured to output a mode selection signal at a frequency in a Radio Frequency (RF) band, the mode selection signal having a frequency response including an oscillatory mode; a transposed delay line comprising: a first frequency mixer configured to receive, as inputs, the mode selection signal and a transposition signal, and configured to provide a first frequency mixer output at an intermediate frequency; an intermediate frequency (IF) delay line comprising: a delay filter configured to receive the first frequency mixer output and configured to provide a delay filter output, the delay filter output having a phase de-correlated from a phase of the transposition signal, and a phase noise suppression loop configured to receive, as inputs, the first frequency mixer output, the delay filter output, and a previous phase noise suppression loop output, the phase noise suppression loop configured to phase shift the delay filter output to produce a phase noise suppression loop output, the phase shift based on accumulation of a detected phase difference between the first frequency mixer output and the previous phase noise suppression loop output; a second frequency mixer configured to receive, as inputs, the phase noise suppression loop output and the transposition signal, and configured to provide an oscillator output in the RF band, the oscillator output being coupled to an input of the mode selection filter.

In an example embodiment, the phase noise suppression loop further comprises a phase frequency detector configured to detect the phase difference between the first frequency mixer output and the previous phase noise suppression loop output; an integrator configured to accumulate the detected phase difference, and a phase shifter configured to phase shift the delay filter output based on the accumulated phase difference, the phase shifter configured to produce the phase noise suppression loop output. In a further example embodiment, the phase frequency detector and phase shifter are voltage based, and the integrator is an integration filter configured to suppress a frequency spur of the accumulated detected phase difference, the integration filter configured to provide a DC control voltage to the phase shifter based on the accumulated detected phase difference. In a further example embodiment, the phase frequency detector is a charge pump phase frequency detector.

In an example embodiment, the transposed delay line oscillator further comprises a transposition oscillator for generating the transposition signal, and a first amplifier and a first power splitter in communication with the transposition oscillator and being co-operable to amplify and split the transposition signal for transmission to each of the first and second frequency mixers. In a further example embodiment, the transposed delay line oscillator comprises a second amplifier connected between the first frequency mixer and a second power splitter, the second amplifier configured to amplify the first frequency mixer output; the second power splitter configured to couple the first frequency mixer output to the phase noise suppression loop and the delay filter.

In an example embodiment, the mode selection signal frequency is in an X-band frequency range between about 8 GHz and about 12 GHz, and the transposition oscillator is a microwave synthesizer.

In an example embodiment, the first frequency mixer is an image rejection mixer configured to remove an RF sideband from the first frequency mixer output, and the second frequency mixer is an image rejection mixer configured to remove an RF sideband from the oscillator output. In a further example embodiment, the transposed delay line further comprises a first hybrid coupler and a first sideband switch provided between the first frequency mixer and the delay filter, the first hybrid coupler and the first sideband switch co-operable to enable selection of a lower or upper RF sideband of the first frequency mixer output, and a second hybrid coupler and a second sideband switch provided between the phase shifter and the second frequency mixer, the second hybrid coupler and the second sideband switch co-operable to enable selection of a lower or upper RF sideband communicated to the second frequency mixer input.

In an example embodiment, the delay filter has a time delay and a center frequency between about 1 kHz and about 3 GHz, wherein the intermediate frequency is substantially equal to the delay filter center frequency.

In an example embodiment, the delay filter is a bandpass filter having a time delay and a delay filter bandpass, the bandpass based on a delay filter center frequency and a delay filter bandwidth, wherein the intermediate frequency is within the delay filter bandpass.

In an example embodiment, the delay filter is a bandpass filter having a time delay, a delay filter center frequency and a delay filter bandwidth between about 20 MHz and about 150 MHz, wherein the intermediate frequency is substantially equal to the delay filter center frequency.

In an example embodiment the delay filter is a surface acoustic wave (SAW) filter. In a further example embodiment, the delay filter center frequency is about 452 MHz, the delay filter bandwidth is about 90 MHz, and the time delay of the delay filter is about 20 microseconds.

In an example embodiment, the time delay of the delay filter is between about 1 microsecond and about 100 microseconds.

In an embodiment the mode selection filter comprises: a first bandpass filter configured to receive, as an input, the oscillator output of the transposed delay line, the first bandpass filter having a first bandpass; a second bandpass filter configured to receive, as an input, the output of the first bandpass filter, the second bandpass filter having a second bandpass overlapping with the first bandpass for co-operably providing an overlapping bandpass configured to isolate a desired oscillatory mode. In a further example embodiment, the transposed delay line oscillator comprises a plurality of frequency mixers and a plurality of transposition oscillators in communication with the first and second bandpass filters, the plurality of frequency mixers and transposition oscillators configured to: provide to the first bandpass filter, the oscillator output, transposed to a first intermediate frequency; provide to the second bandpass filter, an output of the first bandpass filter transposed to a second intermediate frequency, and output the mode selection signal, based on transposing an output of the second bandpass filter to the mode selection signal frequency.

In an example embodiment the first bandpass filter has a first center frequency and the first mode intermediate frequency is substantially equal to the first center frequency, and the second bandpass filter has a second center frequency and the second mode intermediate frequency is substantially equal to the second center frequency.

In an example embodiment the overlap bandpass is between the first mode intermediate frequency and the second mode intermediate frequency. In a further example embodiment, the overlap bandpass is based on a reciprocal of the delay filter time delay.

In an example embodiment the first center frequency and the second center frequency are between about 1 kHz and about 3 GHz.

In an example embodiment the first and second bandpass filters are electronically tunable filters (ETF).

In an aspect, a method of suppressing phase noise in a transposed delay line oscillator, the method comprising: generating a mode selection signal at a reference frequency in a Radio Frequency (RF) band, the mode selection signal having a frequency response including an oscillatory mode;

transposing the mode selection signal with a transposition signal to generate a transposed mode selection signal at an intermediate frequency; delaying the transposed mode selection signal by a time delay to generate a delayed mode selection signal, wherein a phase of the delayed mode selection signal is de-correlated from a phase of the transposition signal; phase shifting the delayed mode selection signal to generate a phase noise suppressed mode selection signal by: detecting a phase difference between the transposed mode selection signal and a previous phase noise suppressed mode selection signal; generating a new total phase difference based on accumulating the detected phase difference with a previous total phase difference, and phase shifting the delayed mode selection signal based on the new total phase difference; transposing the phase noise suppressed mode selection signal with a transposition signal to generate a transposed delay line output at the reference frequency, wherein the transposed delay line output is coupled to a mode selection filter for use in generating the mode selection signal.

In an aspect, a transposed delay line comprising: a first frequency mixer configured to receive, as inputs, a Radio Frequency (RF) signal in an RF band and a transposition signal, and configured to provide a first frequency mixer output at an intermediate frequency; an intermediate frequency (IF) delay line comprising: a delay filter configured to receive the first frequency mixer output and configured to provide a delay filter output, the delay filter output having a phase de-correlated from a phase of the transposition signal, and a phase noise suppression loop configured to receive, as inputs, the first frequency mixer output, the delay filter output, and a previous phase noise suppression loop output, the phase noise suppression loop configured to phase shift the delay filter output to produce a phase noise suppression loop output, the phase shift based on accumulation of a detected phase difference between the first frequency mixer output and the previous phase noise suppression loop output; a second frequency mixer configured to receive, as inputs, the phase noise suppression loop output and the transposition signal, and configured to provide a transposed delay line output, in the RF band, coupled to the first frequency mixer, wherein the RF signal is based on the transposed delay line output.

In an aspect, a method of suppressing phase noise in a transposed delay line, the method comprising: transposing a Radio Frequency (RF) signal with a transposition signal to generate a transposed mode selection signal at an intermediate frequency; delaying the transposed RF signal by a time delay to generate a delayed RF signal, wherein a phase of the delayed RF signal is de-correlated from a phase of the transposition signal; phase shifting the delayed RF signal to generate a phase noise suppressed RF signal by: detecting a phase difference between the transposed mode selection signal and a previous phase noise suppressed RF signal; generating a new total phase difference based on accumulating the detected phase difference with a previous total phase difference, and phase shifting the delayed RF signal based on the new total phase difference; transposing the phase noise suppressed RF signal with a transposition signal to generate a transposed delay line output in an RF band, wherein the RF signal is based on the transposed delay line output.

DETAILED DESCRIPTION

For the purpose of promoting an understanding of the principles of the disclosure, reference will now be made to the features illustrated in the drawings and specific language will be used to describe the same. It will nevertheless be understood that no limitation of the scope of the disclosure is thereby intended. Any alterations and further modifications, and any further applications of the principles of the disclosure as described herein are contemplated as would normally occur to one skilled in the art to which the disclosure relates. It will be apparent to those skilled in the relevant art that some features that are not relevant to the present disclosure may not be shown in the drawings for the sake of clarity.

At the outset, for ease of reference, certain terms used in this application and their meaning as used in this context are set forth below. To the extent a term used herein is not defined below, it should be given the broadest definition persons in the pertinent art have given that term as reflected in at least one printed publication or issued patent. Further, the present processes are not limited by the usage of the terms shown below, as all equivalents, synonyms, new developments and terms or processes that serve the same or a similar purpose are considered to be within the scope of the present disclosure.

FIG. 1 illustrates a conventional optoelectronic oscillator (OEO) 100 comprising a set of optical domain components 10, a set of Radio Frequency (RF) domain components 30, and a downconverter 20 coupled between the set of optical domain components 10 and the set of RF domain components 30. The downconverter is configured to provide the RF domain components 30 with an RF signal based on the output of the optical domain components 10. Implementing an optical delay line may improve phase noise by up to 40 dB relative to conventional microwave source technology.

The OEO 100 comprises an optical source 11 for generating an optical signal, modulated by an RF signal, using an optical modulator 12. The modulated optical signal is transmitted through an optical delay line 13, such as a wound spool of single mode optical fiber, or an optical resonator. A corresponding improvement in the modulated optical signal quality (Q) factor is achieved based on the length, or delay, of the optical delay line. The output of the optical domain components 10 is provided to a downconverter 20 which outputs an RF signal proportional to the modulated optical signal's intensity. The output of the downconverter 20 is amplified by an RF gain element 31, filtered by filter 32, and provided back to optical modulator 12. The RF gain element 31 is selected to compensate for loss in the electro optical loop defined in combination by the optical modulator 12, optical delay line 13, downconverter 20, RF gain element 31, and filter 32.

A drawback of the OEO 100 illustrated in FIG. 1 is that, as the optical delay line length increases, spacing between modes is reduced, creating a tradeoff between Q factor and mode spacing. The optical delay line 13 itself is also susceptible to mechanical perturbances and thermal expansion or contraction. Additionally, a spool of optical fiber employed in a conventional OEO may be in the order of 11 inches in diameter and 4 inches in height, which may be an undesirably large form factor for some systems.

Accordingly, embodiments of the present disclosure aim to provide improvements in RADAR systems and RADAR sensitivity, by alleviating at least one of the aforementioned challenges posed by conventional OEO systems.

A transposed delay line oscillator including a mode selection filter and a transposed delay line is provided. The transposed delay line oscillator achieves comparable (or better) performance to conventional OEO systems which implement optical delay lines of equal delay to the transposed delay line. As disclosed herein, an output of the transposed delay line is coupled to an input of the mode selection filter to establish an oscillator loop. Based on the transposed delay line output, the mode selection filter generates a mode selection signal including an isolated oscillatory mode, in a Radio Frequency (RF) band. The transposed delay line receives the mode selection signal for transposition to an intermediate frequency of an intermediate frequency (IF) delay line. The IF delay line includes a delay filter and a phase noise suppression loop configured to suppress de-correlated transposition phase noise resulting from the delay filter. Suppression of phase noise in the IF delay line enables cancellation of transposition phase noise when transposing the IF delay line output to the RF band.

A transposed delay line according to an embodiment of the present disclosure enables use of a transposed delay line oscillator having a fundamentally different structure than conventional oscillators, such as the OEO 100, illustrated in FIG. 1. A transposed delay line according to at least one embodiment of the present disclosure removes the need for an optical delay line, providing improvements over known systems in terms of at least one of: physical size, mechanical resilience, and susceptibility to thermal expansion and contraction. Eliminating the optical delay line further enables a fully electrical implementation in the RF domain, rather than an opto-electronic implementation across the optical and RF domains, as is the case with a known OEO. Further, frequency transposition enables providing the transposed delay line at an arbitrary intermediate frequency, enabling use of higher Q-factor components, while also maintaining the benefit of a wide broadband input.

Figure 2A:
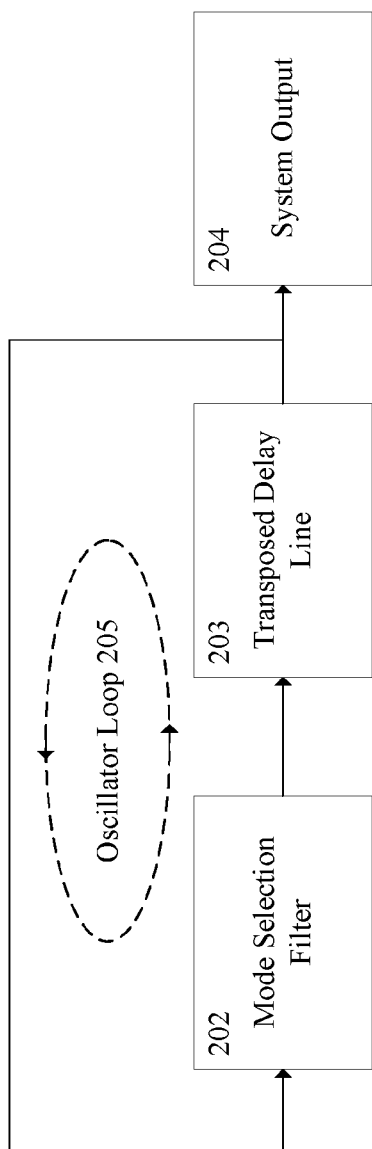
FIG. 2A illustrates a block diagram of a transposed delay line oscillator according to an embodiment of the present disclosure.

FIG. 2A illustrates a system-level block diagram of a transposed delay line oscillator 200 according to an embodiment of the present disclosure. The transposed delay line oscillator 200 includes a mode selection filter 202, a transposed delay line 203, and a system output 204. The output of the transposed delay line 203 is coupled to the system output 204 and an input of the mode selection filter 202, where the mode selection filter 202 and transposed delay line 203 are co-operable to define an oscillator loop 205. As will be described in greater detail with regards to FIGS. 8-12, mode selection filter 202 enables isolating an oscillatory mode in an RF band. In an embodiment the mode selection filter generates a mode selection signal between about 1 GHz and about 40 GHz. In an embodiment, the mode selection signal is provided in an X-Band frequency range. In an embodiment, the mode selection signal is provided between about 8 GHz and about 12 GHz. In an embodiment, the mode selection signal is provided at less than 1 GHz.

Figure 2B:
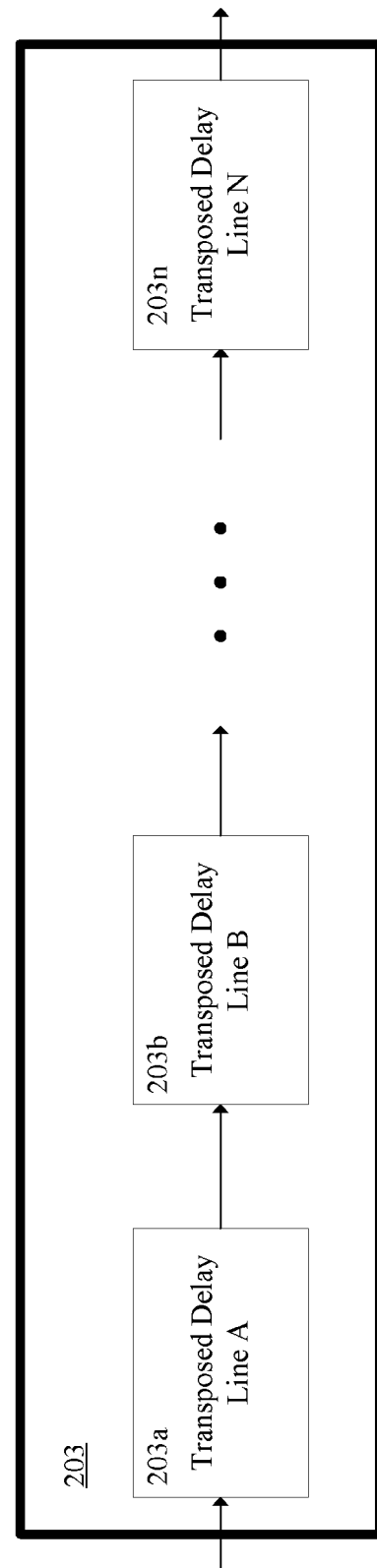
FIG. 2B illustrates a block diagram of a plurality of serially cascaded transposed delay lines.

Transposed delay line 203 transposes the mode selection filter output to an intermediate frequency using a transposition signal. In an embodiment, the mode selection filter output is a mode selection signal having a frequency response including an oscillatory mode. The intermediate frequency is based on a difference between a transposition frequency of the transposition signal and a RF band frequency of the mode selection filter output. In this manner the transposition signal frequency can be tuned to transpose the mode selection filter output to a desired intermediate frequency. Accordingly, frequency transposition enables operating the transposed delay line oscillator 200 over a wide broadband input. In an embodiment, the intermediate frequency is within a bandwidth of the transposed delay line 203. In an embodiment, the intermediate frequency is at, or about, a center frequency of the transposed delay line 203. In an embodiment as illustrated in FIG. 2B, transposed delay line 203 may comprise a plurality of transposed delay lines, 203a, 203b, . . . , and 203n, serially cascaded to provide a group delay based on the aggregate delay of each of the plurality of transposed delay lines 203a, 203b, . . . , and 203n.

Figure 3:
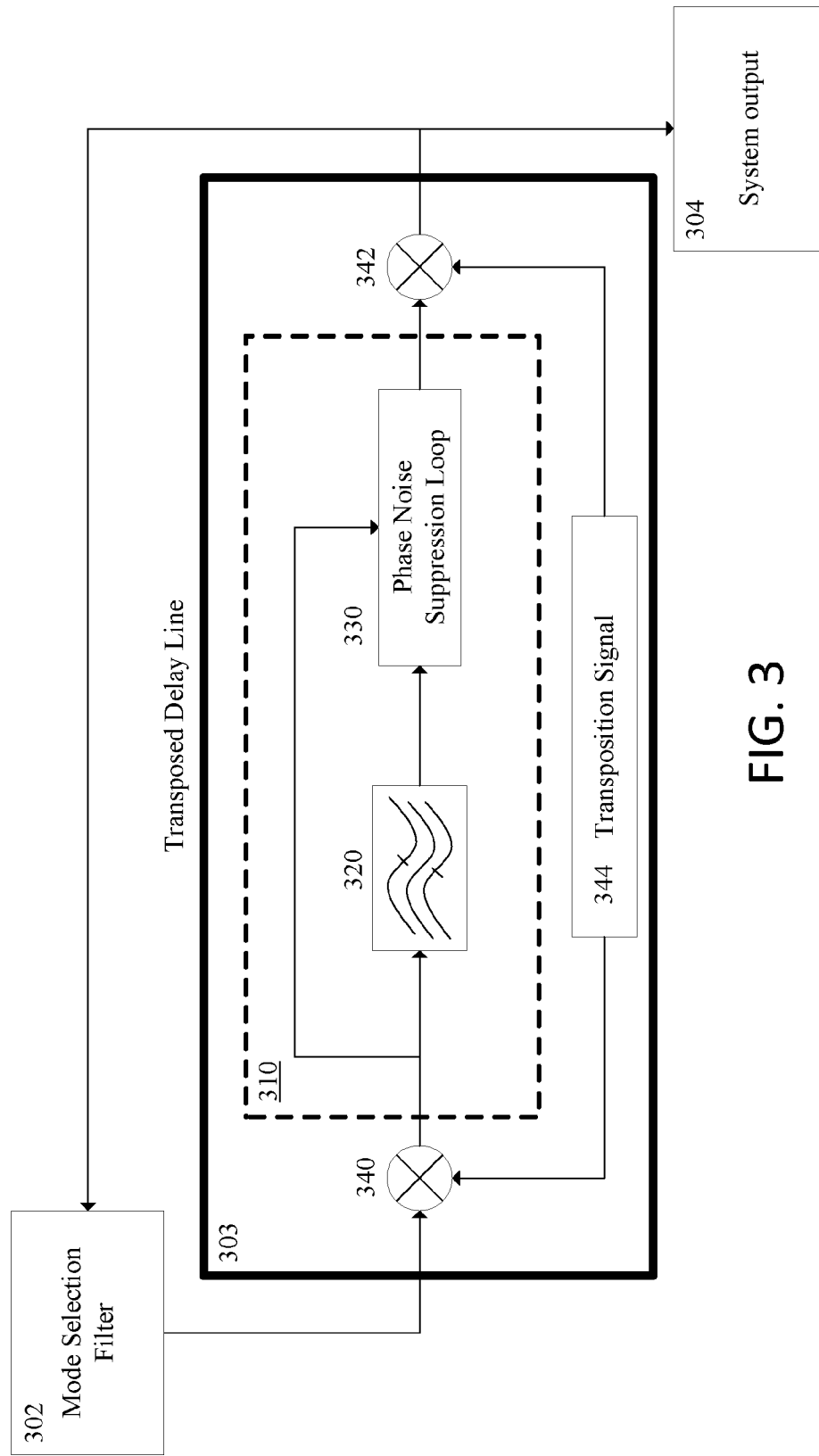
FIG. 3 illustrates the block diagram of FIG. 2A including a schematic of the transposed delay line having a delay filter and a phase noise suppression loop.

FIG. 3 illustrates a system level block diagram of a transposed delay line oscillator 300 according to an embodiment of the present disclosure. The oscillator 300 includes a mode selection filter 302, transposed delay line 303, and system output 304, as similarly illustrated in FIG. 2A. The transposed delay line 303 includes an intermediate frequency (IF) delay line 310 provided between an input frequency mixer 340 and an output frequency mixer 342. The IF delay line 310 further includes a delay filter 320 and a phase noise suppression loop 330. The delay filter 320 is coupled to each of the input frequency mixer 340 and phase noise suppression loop 330. The phase noise suppression loop is coupled to each of the delay filter 320, input frequency mixer 340, and output frequency mixer 342.

The frequency mixers 340 and 342 are configured to receive an input signal and a transposition signal 344, for generating an output signal based on transposing the input signal with the transposition signal. In an embodiment, the input frequency mixer 340 receives the mode selection filter output and transposition signal 344 as inputs, for providing a first frequency mixer output transposed to an intermediate frequency. The first frequency mixer output is provided as an input to each of the delay filter 320 and phase noise suppression loop 330.

The delay filter 320 is configured to receive the first frequency mixer output and generate a delay filter output based on a corresponding time delay of the delay filter. As a result of the delay, the delay filter output has an improved Q factor and a phase de-correlated from a phase of the transposition signal, resulting in de-correlated transposition signal phase noise. The phase noise suppression loop 330 suppresses such de-correlated phase noise by phase shifting the delay filter output based on a detected phase difference.

The phase noise suppression loop 330 is configured to produce a phase noise suppression loop output matched in phase with the transposition signal phase based on phase shifting the delay filter output. In an embodiment the phase shift is based on a detected phase difference. In an embodiment the output frequency mixer 342 receives the phase noise suppression loop output and the transposition signal 344 as inputs having matching phase. The matched phases enable the output frequency mixer 342 to substantially cancel transposition signal phase noise. In an embodiment, an output of the output frequency mixer 342 is provided as the transposed delay line oscillator output 304. In an embodiment, the output of the output frequency mixer 342 is provided as an input to the mode selection filter 302. In an embodiment, an output of the output frequency mixer 342 is provided at a frequency in an RF band based on transposing the inputs of the output frequency mixer. In an embodiment, the output frequency mixer output is provided at an output frequency in an RF band based on transposing the phase noise suppression loop output with the transposition signal.

Figure 4:
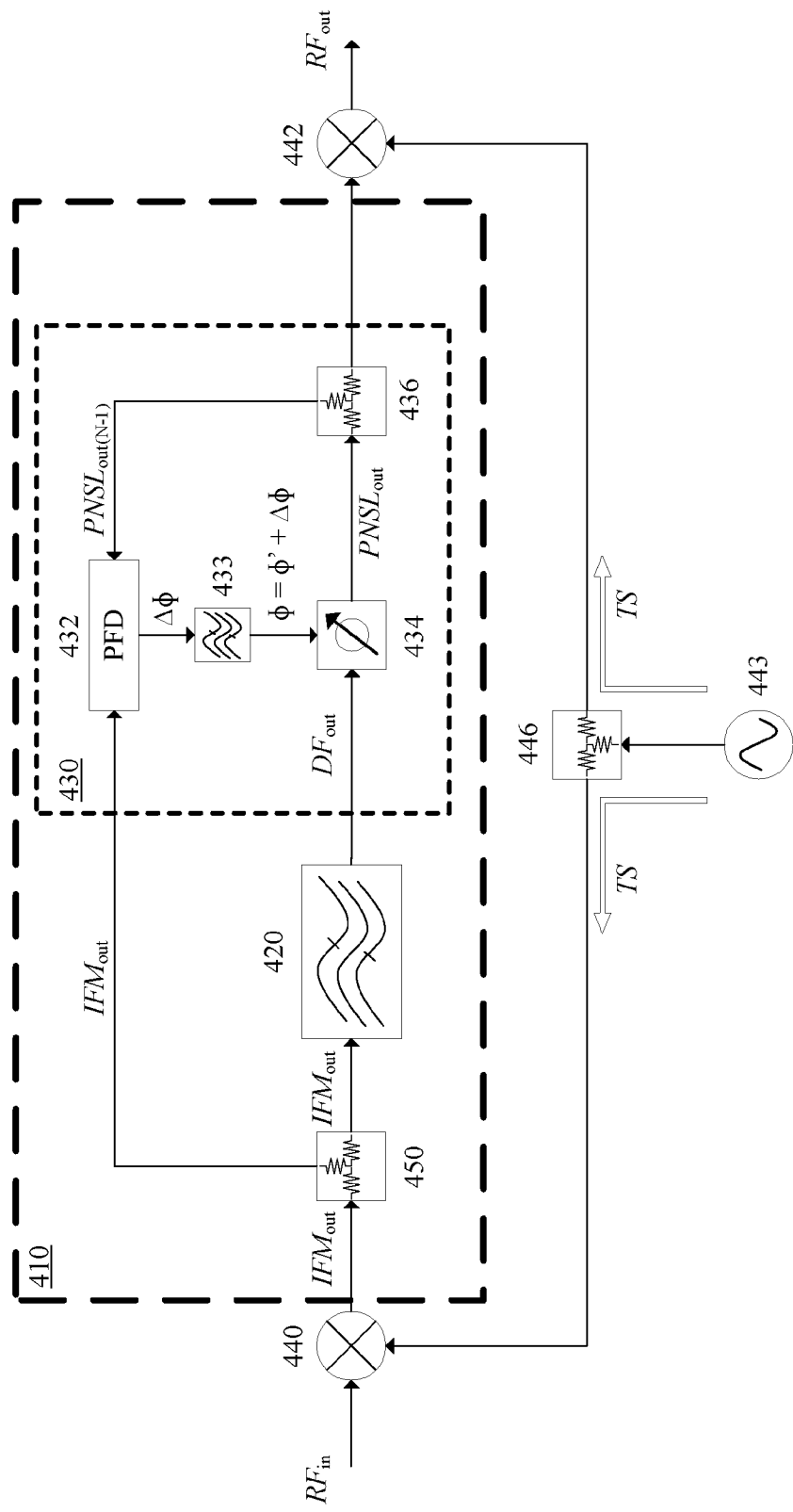
FIG. 4 illustrates a schematic of a transposed delay line having a delay filter and a phase noise suppression loop according to an embodiment of the present disclosure.

FIG. 4 illustrates a transposed delay line 403 according to an embodiment of the present disclosure. Transposed delay line 403 includes an input frequency mixer 440 and an output frequency mixer 442. An IF delay line 410 is provided between the frequency mixers 440 and 442. Embodiments of frequency mixers 440 and 442 include image rejection mixers, down conversion mixers, up-conversion mixers, and other mixers operable to provide frequency transposition to-and-from an intermediate frequency based on transposing two received input signals. In an embodiment, the input frequency mixer 440 is coupled to an output of a mode selection filter, and the output frequency mixer 442 is coupled to an input of the mode selection filter, the transposed delay line 403 thereby forming an oscillator loop with the mode selection filter, such as a mode selection filter 203 as described herein.

The IF delay line 410 includes an optional power splitter 450, delay filter 420, and phase noise suppression loop 430. The phase noise suppression loop 430 includes a phase frequency detector (PFD) 432, integrator 433, phase shifter 434, and output power splitter 436. In an embodiment a power splitter 446 couples a transposition signal TS, generated by a local oscillator 443, to each of the frequency mixers 440 and 442. In an embodiment, the local oscillator 443 is a microwave synthesizer. In an embodiment, transposed delay line 403 is further coupled to a mode selection filter, such as a mode selection filter 203 as depicted for example in FIGS. 2 and 3. In an embodiment, the input signal $RF_{in}$ is a mode selection signal having a frequency response including an oscillatory mode. In an embodiment, input frequency mixer 440 receives an input signal $RF_{in}$ such as a mode selection signal from a mode selection filter, having a frequency in a RF band.

Input frequency mixer 440 is configured to receive two inputs. In an embodiment, input frequency mixer 440 is configured to receive an input signal $RF_{in}$ and a transposition signal TS, as inputs, and is configured to provide an input frequency mixer output $IFM_{out}$. In an embodiment, input frequency mixer output $IFM_{out}$ is provided at an intermediate frequency based on transposing the input signal $RF_{in}$ with the transposition signal TS. In this manner, local oscillator 443 may generate transposition signal TS at a given transposition frequency required to transpose the input signal $RF_{in}$ to a desired intermediate frequency. In an embodiment, the intermediate frequency is within a bandwidth of delay filter 410. In an embodiment, the intermediate frequency is at, about, a center frequency of delay filter 410. In an embodiment, the input signal $RF_{in}$ is a mode selection signal from a mode selection filter, having a frequency in a RF band. In an embodiment, the mode selection signal has a frequency response including an oscillatory mode.

Frequency transposition enables a transposed delay line to operate across a broadband input by adjusting the transposition frequency of a transposition signal TS for transposing the input signal $RF_{in}$ to a desired intermediate frequency. Advantageously, frequency transposition also enables providing the IF delay line 410 at a fixed frequency, if desired. As an illustrative example of frequency transposition, an input signal $RF_{in}$ is provided at a frequency of 10 GHz, and a local oscillator 443 generates a transposition signal TS having a transposition frequency of 10.452 GHz. Input frequency mixer 440 is configured to receive the 10 GHz input signal $RF_{in}$ and the 10.452 GHz transposition signal TS, for generating a first frequency mixer output $IFM_{out}$ at an intermediate frequency. In an embodiment, transposing a 10 GHz input signal $RF_{in}$ and a 10.452 GHz transposition signal TS generates first frequency mixer output $IFM_{out}$ at an intermediate frequency of 452 MHz. Local oscillator TS may also provide transposition signal TS at a different transposition frequency to enable input frequency mixer 440 to generate a first frequency mixer output $IFM_{out}$ at the same intermediate frequency, or at a different intermediate frequency. For example, a 10 GHz input signal $RF_{in}$ and a 9.548 GHz transposition signal TS transpose to a 452 MHz intermediate frequency. In another example, a 11 GHz input signal $RF_{in}$ and a 10 GHz transposition signal TS transpose to a 1 GHz intermediate frequency. In another example, an 11 GHz input signal $RF_{in}$ and 10.548 GHz transposition signal TS transpose to a 452 MHz intermediate frequency. Accordingly, the transposition signal TS may be adjusted to maintain the IF signal at a fixed intermediate frequency, while the $RF_{in}$ signal is at a different frequency. In this manner a delay element, such as delay filter 420, can remain at a fixed center frequency, such as 452 MHz. Depending on the center frequency of the delay element the transposition signal may be adjusted to enable generating an IF frequency at or about, the center band of the delay element. IF frequencies from 10 kHz to up to 4 GHz are achievable based on conventional mixer technology. Mixer technology improvements are expected to yield higher IF frequencies readily applicable to the present disclosure by anyone skilled in the art. Transposition to an IF center frequency of 10 GHz for example will allow a dielectric resonator to be used as a delay element.

The delay filter 410 and the phase noise suppression loop 430 each receive the input frequency mixer output $IFM_{out}$. In an embodiment, delay line 410 includes a power splitter 450 configured to couple input frequency mixer output $IFM_{out}$ to the delay filter 420 and the phase noise suppression loop 430. The delay filter 420 subjects input frequency mixer output $IFM_{out}$ to a delay in generating a delay filter output $DF_{out}$. The delay causes a phase shift such that delay filter output $DF_{out}$ is out-of-phase with the transposition signal TS, resulting in de-correlated transposition signal phase noise. Embodiments of a delay filter 420 include a bandpass filter, a surface acoustic wave filter (SAW), and an electronically tunable filter (ETF). In an embodiment, delay filter 420 has a time delay for improving a Q factor.

The phase noise suppression loop 430 is configured to receive, as inputs, input frequency mixer output $IFM_{out}$, delay filter output $DF_{out}$, and a previous phase noise suppression loop output $PNSL_{out(N-1)}$, for use in supressing de-correlated phase noise resulting from the delay filter 420. Phase noise suppression loop 430 is configured to phase shift the delay filter output $DF_{out}$ based on an accumulated phase φ, to generate a phase noise suppression loop output $PNSL_{out}$, having a phase matched to a phase of transposition signal TS. Phase noise in this sense originates with the transposition signal TS, provided to each of the frequency mixers 440 and 442. Such phase noise is transmitted through delay line 410 as part of input frequency mixer output $IFM_{out}$ As a result of a time delay with delay filter 420, the phase noise becomes de-correlated from a phase of the transposition signal TS provided to output frequency mixer 442. Accordingly, without phase noise suppression, the de-correlated phase noise does not cancel at the output frequency mixer 442, and instead transposes through to an output of the frequency mixer output 442. In an embodiment, the phase noise suppression loop output $PNSL_{out}$ is provided as an input to output frequency mixer 442 for transposition with transposition signal TS. In an embodiment, the phase noise suppression loop 430 is configured to generate the phase noise suppression loop output $PNSL_{out}$ having a phase matched to a phase of transposition signal TS, to enable output mixer 442 to substantially cancel phase noise present in the transposition signal TS received from the local oscillator 443.

In an embodiment, the phase noise suppression loop 430 is configured to adjust the phase of the delay filter output $DF_{out}$ to match a phase of the transposition signal TS. In this example embodiment, the delay filter output $DF_{out}$ is phase shifted to produce a phase noise suppression loop output $PNSL_{out}$. The phase shift is based on accumulating a phase difference Δφ detected between the first frequency mixer output IFM$_{out}$ and a previous phase noise suppression loop output PNSL$_{out(N-1)}$ provided as feedback to the phase noise suppression loop 430.

In an embodiment, the phase noise suppression loop is configured to phase shift the delay filter output DF$_{out}$ based on an accumulated phase φ, generated using a feedback loop comprising phase shifter 434, power splitter 436, phase frequency detector (PFD) 432, and integrator 433. In this example embodiment, the PFD 432 detects a phase difference Δφ between the input frequency mixer output IFM$_{out}$ and a previous phase noise suppression loop output PNSL$_{out(N-1)}$. The PFD 432 provides the detected phase difference Δφ to an integrator 433. The integrator 433 accumulates the phase difference Δφ with a previous accumulated phase φ' to generate the accumulated phase φ. The phase shifter 434 phase shifts the delay filter output DF$_{out}$ based on a control signal proportional to the accumulated phase φ, provided by integrator 433. In this manner, the phase noise suppression loop 430 causes the delay filter output phase, with each oscillator loop cycle, to converge and match the transposition signal phase, thereby suppressing de-correlated phase noise arising from a delay of delay filter 420.

In an embodiment, PFD 432 and phase shifter 434 are voltage based and integrator 433 is an integration filter configured to receive a control signal, from PFD 432, proportional to the detected phase difference Δφ, and is further configured to generate a DC voltage signal, proportional to accumulated phase φ, for phase shifter 434. In an embodiment, integrator 433 is an integrator filter configured to suppress frequency spurs in the detected phase difference Δφ provided by PFD 432. In an embodiment, PFD 432 is a charge pump phase frequency detector. In an embodiment, phase shifter 434 phase shifts delay filter output DF$_{out}$ based on a detected phase difference Δφ received from PFD 432.

Figure 5:
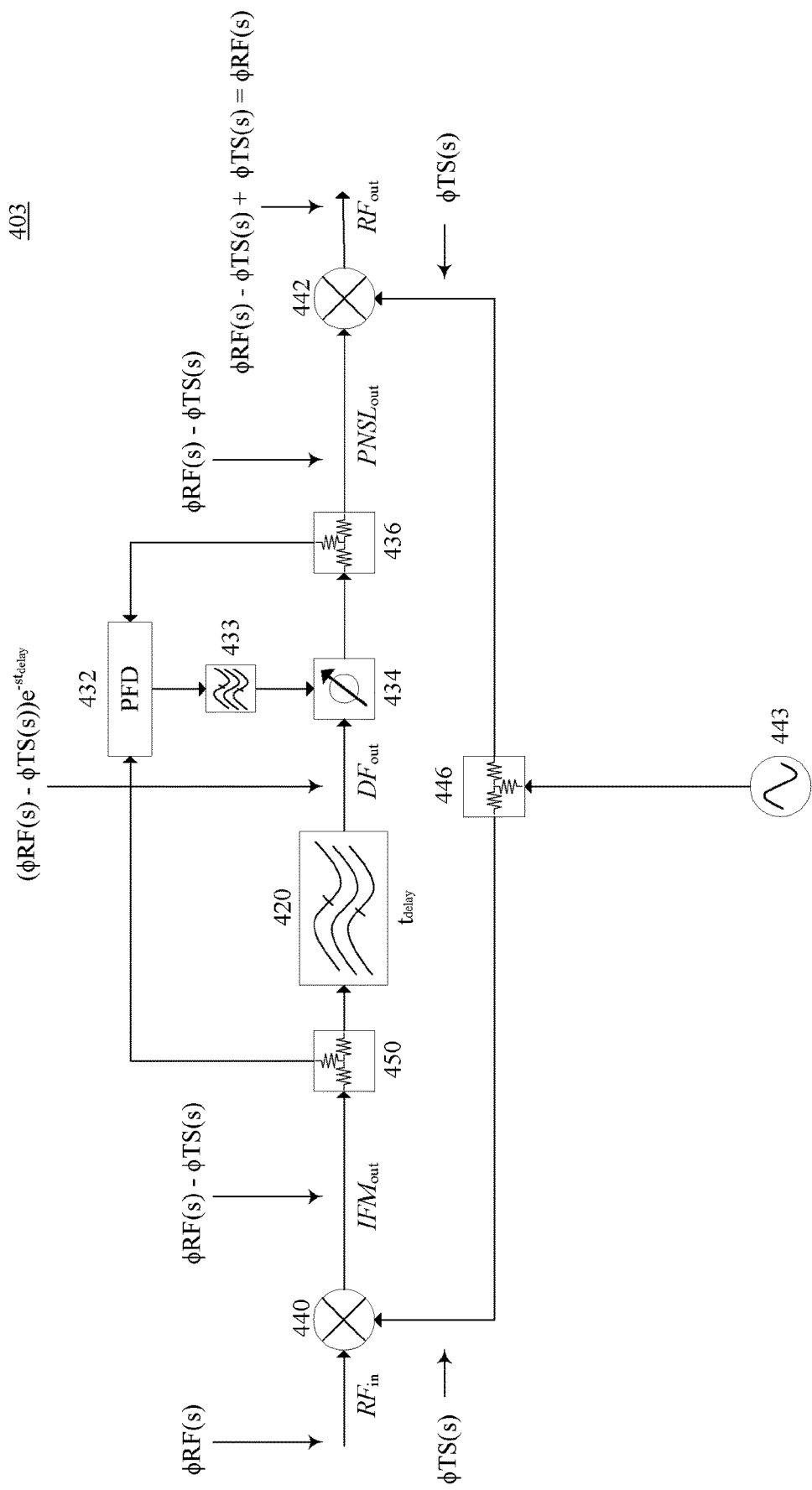
FIG. 5 illustrates the phase state of a signal transmitting through the transposed delay line of FIG. 4.

FIG. 5 illustrate the transposed delay line 403 as depicted in FIG. 4, further including annotations describing the state of a signal transmitting through the transposed delay line based on an input signal φRF(s), such as a mode selection signal from a mode selection filter, provided at a frequency in the RF band, and a transposition signal φTS(s). Input frequency mixer 440 generates input frequency mixer output IFM$_{out}$ based on transposing φRF(s) and φTS(s), resulting in the signal φRF(s)–φTS(s) being provided at an intermediate frequency. Input frequency mixer output IFM$_{out}$ is further provided to each of delay filter 420 and PFD 432. Delay filter 420 generates delay filter output DF$_{out}$ based on delaying input frequency mixer output IFM$_{out}$ by a time delay t$_{delay}$ resulting in the signal (φRF(s)–φTS(s))e$^{-s t delay}$ being provided to phase shifter 434 with de-correlated phase noise. Phase shifter 434 generates the phase noise suppression loop output PNSL$_{out}$ based on phase shifting the delay filter output DF$_{out}$ by a detected phase difference, to suppress de-correlated phase noise, resulting in the signal φRF(s)–φTS(s) being provided to the output frequency mixer 442. Output frequency mixer 444 generates output frequency mixer output RF$_{out}$, or system output signal, based on transposing PNSL$_{out}$ and φTS(s), the inputs to the output frequency mixer 442 having matching phases, resulting in phase noise cancellation in the output frequency mixer output RF$_{out}$.

Figure 6:
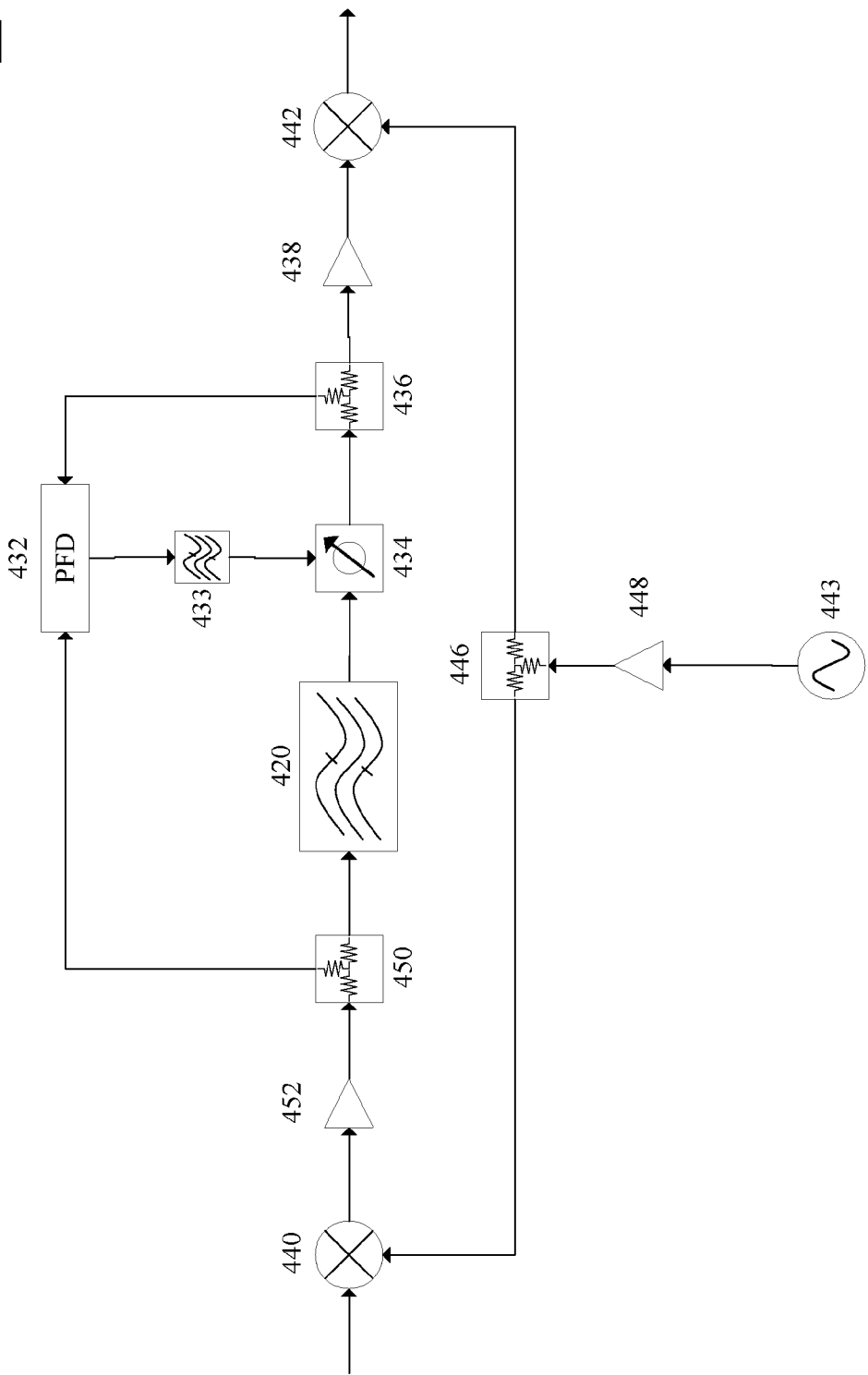
FIG. 6 illustrates the transposed delay line according to FIG. 4, further comprising a plurality of amplifiers and a transposition oscillator.

FIG. 6 illustrates an embodiment of a transposed delay line substantially similar to transposed delay line 403 as depicted in FIGS. 4 and 5, but further including three amplifiers 438, 448, and 452, connected in series, respectively with power splitters 436, 446, and 450. Amplifiers 438 and 452 compensate for losses across the delay line and from corresponding power splitters 436 and 450. Amplifier 448 compensates for losses from power splitter 446. Embodiments of amplifiers 438, 448, and 452 include silicon germanium (SiGe), Gallium Nitride (GaN), and Galium Arsenic (GaAs) based amplifiers, and other amplifiers known to those skilled in the art.

Figure 7:
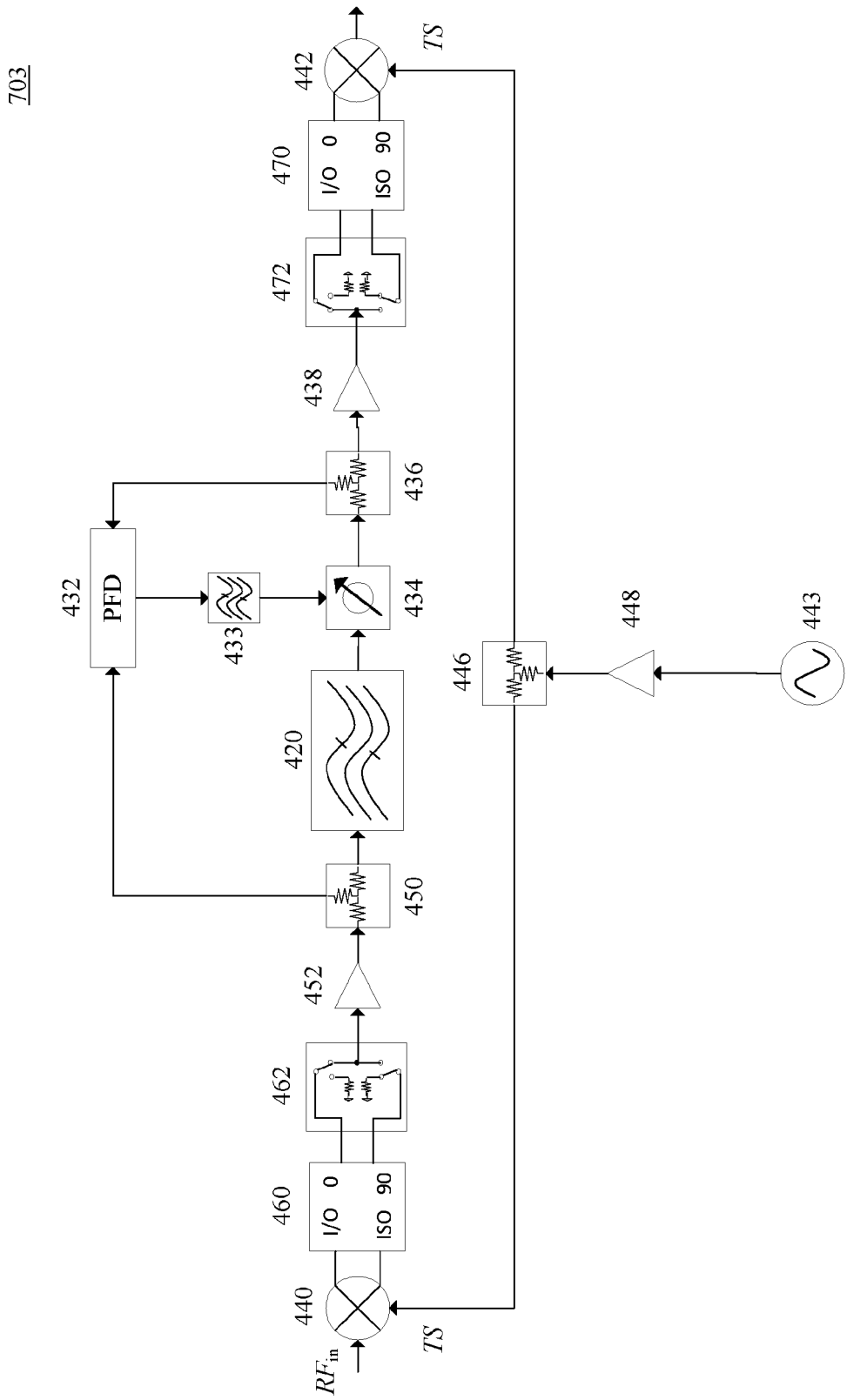
FIG. 7 illustrate the transposed delay line of FIG. 5, further comprising a pair of hybrid couplers and sideband switches in communication with the pair of frequency mixers.

FIG. 7 illustrates a transposed delay line 703 similar to the transposed delay lines 303, 403, and 603, illustrated respectively in FIG. 3, FIG. 4, and FIG. 6. Transposed delay line 703 further includes: a first hybrid coupler 460 and a first sideband selection switch 462 coupled in series between the input frequency mixer 440 and the amplifier 452; a second hybrid couple 470 and a second sideband switch 472 coupled in series between the amplifier 438 and the output frequency mixer 442; and an integration filter 433 coupled between the PFD 432 and the phase shifter 434.

In the embodiment illustrated in FIG. 7, input frequency mixer 440 and output frequency mixer 442 are image rejection mixers, each mixer 440 and 442 including an RF input port and a local oscillator input port. The input frequency mixer 440 is configured to receive an input signal RF$_{in}$ and a transposition signal TS, respectively at the RF input port and the local oscillator input port. The input frequency mixer 440 is configured to generate quadrature signals at an IF output port, based on transposing the input signal RF$_{in}$ with the transposition signal TS. The first hybrid coupler 460 and first sideband switch 462 are co-operable to enable selection of an upper or lower sideband generated at the first frequency mixer IF output port. Similarly, second hybrid coupler 470 and second sideband switch 472 are co-operable to enable selection of an upper or lower sideband for inputting to an RF input port of the output frequency mixer 442.

Figure 8:
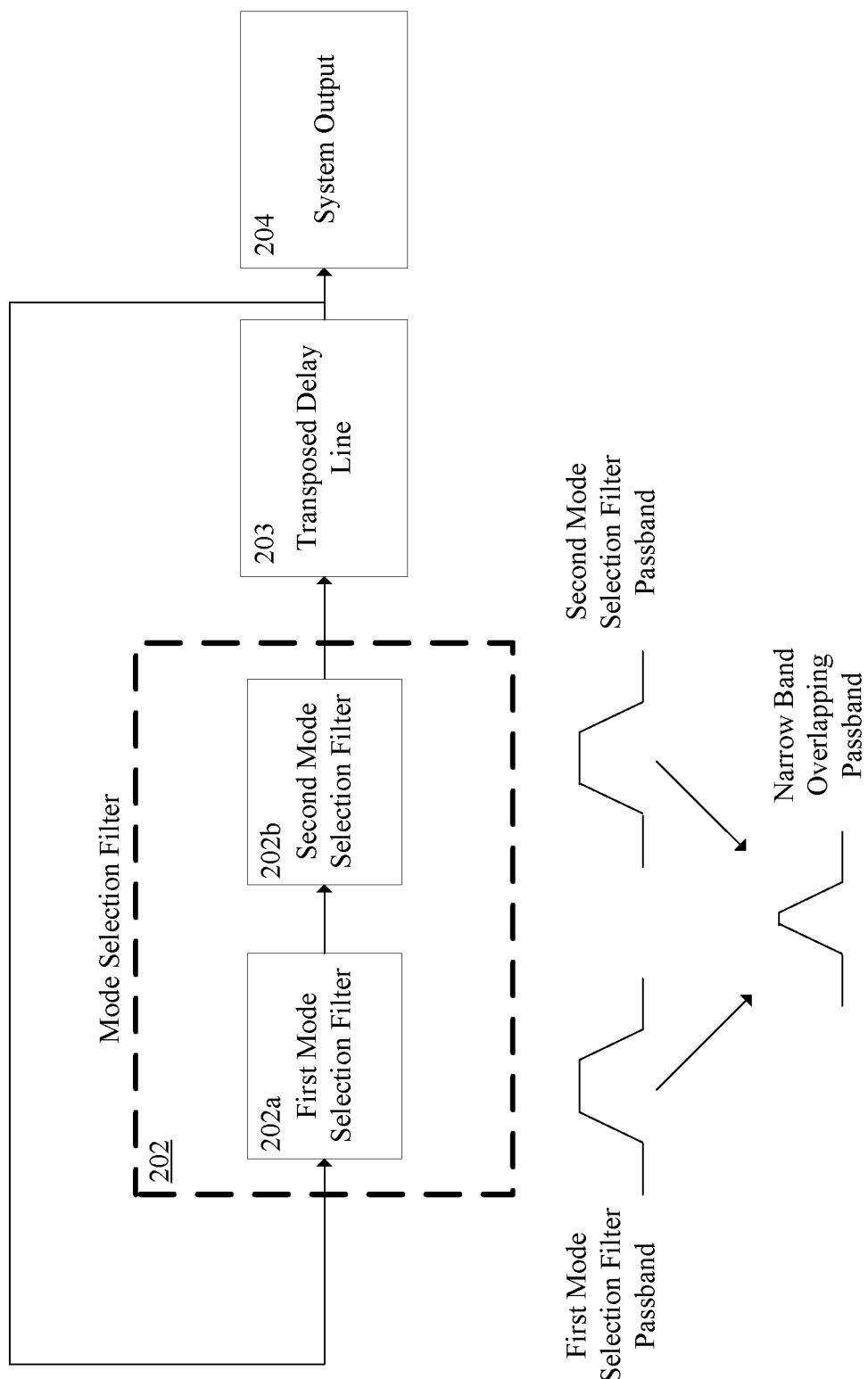
FIG. 8 illustrates a mode selection filter according to an embodiment of the present disclosure comprising first and second mode selection filters having overlapping bandwidths which define an overlapping passband.

FIG. 8 illustrates a transposed delay line oscillator 800 similar to the transposed delay line oscillators 200 and 300, illustrated respectively in FIG. 3 and FIG. 4. In the embodiment illustrated in FIG. 8, transposed delay line oscillator 800 includes a mode selection filter 202 comprising a first mode selection filter 202a and a second mode selection filter 202b. Embodiments of mode selection filters 202a and 202b include passband filters, SAW filters, dispersive SAW filters and electronically tunable filters (ETF).

The mode selection filter 202 enables isolation of a single oscillatory mode. In the embodiment illustrated in FIG. 8, respective passbands of the first and second mode selection filters 202a and 202b are configured to overlap, and define, an overlapping passband, configured to isolate a single oscillatory mode. By adjusting an offset between the first and second mode selection filter passbands, the overlapping passband can be adjusted to a desired bandwidth for a desired oscillatory mode. In this manner, the bandwidth of the overlapping passband can be modified without individually adjusting the bandwidth of the first and second mode selection filter bandwidths. This enables maintaining wide passbands individually across each mode selection filter 202a and 202b while also allowing for isolation of a single oscillatory mode across a narrow overlapping passband.

In an embodiment, the first mode selection filter 202a has a first mode selection filter passband, and is configured to filter a signal provided at a RF band frequency. In an embodiment, the mode selection filter 202 forms an oscillation loop with transposed delay line 203, and the first mode selection filter 202a is configured to receive an output of the transposed delay line 203, such as output signal RF$_{out}$. The second mode selection filter 202b has a second mode selection filter passband, and is configured to filter an output of the first mode selection filter 202a. In this manner, the first and second mode selection filters 202a and 202b are co-operable to provide a mode selection signal having a frequency response including an oscillatory mode of the signal, such as output signal $RF_{out}$. In an embodiment, the first and second mode selection filter passbands are configured to define an overlapping passband based on overlap between the first and second mode selection filter passbands. In an embodiment, the overlapping passband enables isolation of a single oscillatory mode. In an embodiment, the overlapping passband is tunable. In an embodiment, the mode spacing is based on a delay of the transposed delay line 203 and the overlapping passband is based on a reciprocal of the delay. As an illustrative example, the transposed delay line may have a time delay of about 40 microseconds corresponding to a mode spacing of about 25 KHz wherein the overlapping passband has a bandwidth less than 25 KHz.

The first and second mode selection filter passbands can maintain relatively wide passbands while also defining a narrow overlapping passband based on adjusting a frequency spacing between the first and second mode selection filter passbands. In an embodiment, the overlapping passband is based on a frequency spacing between the first and second mode selection filter passbands. In an embodiment, the first mode selection filter has a first mode selection filter center frequency, the second mode selection filter has a second mode selection filter center frequency, and the frequency spacing is based on a difference between the first and second mode selection filter center frequencies. In an embodiment, the frequency spacing between the first and second mode selection filter passbands is adjusted to define an overlapping passband configured to isolate a single oscillatory mode.

Figure 9:
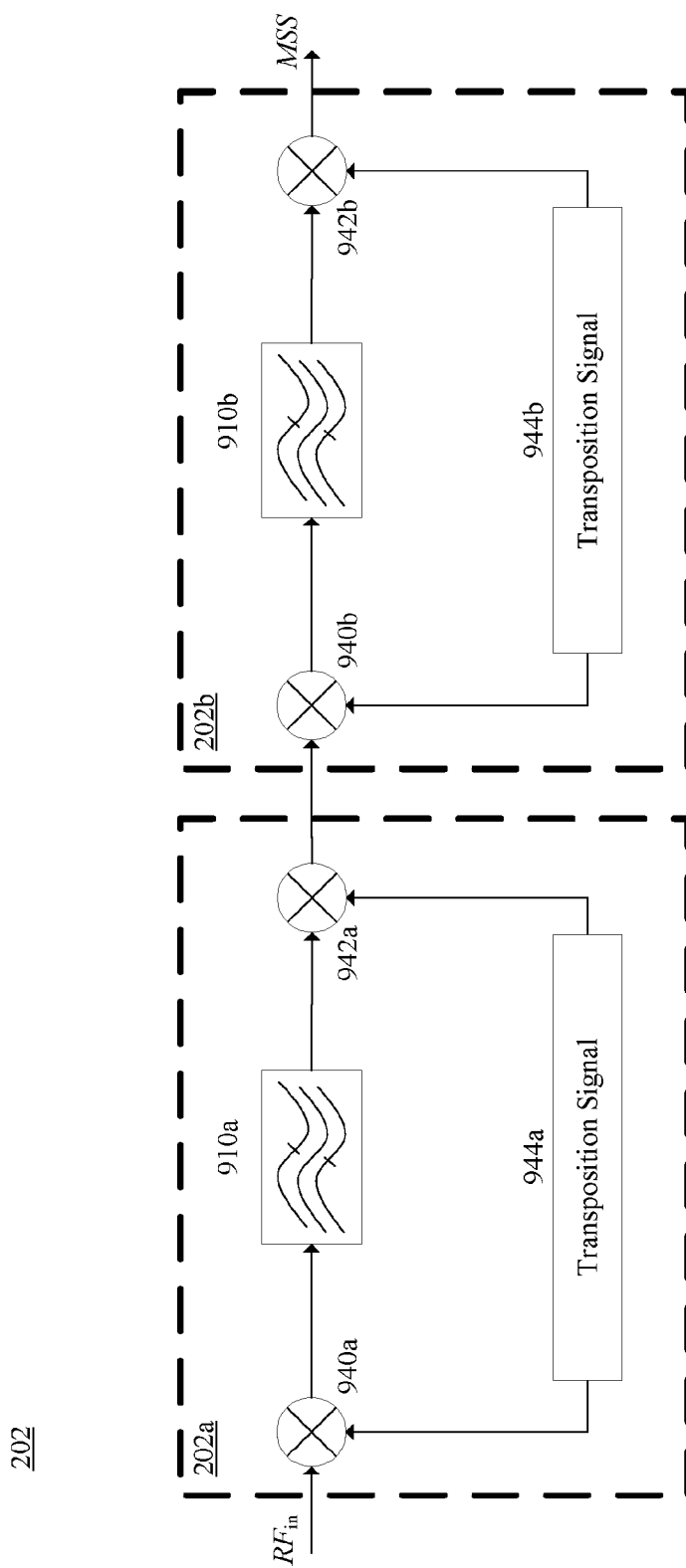
FIG. 9 illustrates the mode selection filter according to FIG. 8, wherein the first and second mode selection filters are transposed to a first intermediate frequency and a second intermediate frequency, respectively.

FIG. 9 illustrates an embodiment of a mode selection filter 202 comprising a first mode selection filter 202a and a second mode selection filter 202b. In an embodiment, first mode selection filter 202a comprises a first passband filter 910a provided between a pair of frequency mixers 940a and 942a. The first frequency mixer 940a is configured to receive an input signal $RF_{in}$ and a transposition signal 944a as inputs, and generate a first frequency mixer output at a first intermediate frequency. In an embodiment, the first frequency mixer 940a is coupled to an output of a transposed delay line, such as transposed delay line 403, and is configured to receive the transposed delay line output $RF_{out}$, as the input signal $RF_{in}$. The first frequency output is provided to a first passband filter 910a, having a first passband. The second frequency mixer 942a is configured to receive the first passband filter output and the transposition signal 944a as inputs, for generating a second frequency mixer output. Similarly, second mode selection filter 202b comprises a second passband filter 910b provided between a pair of frequency mixers 940b and 942b. The third frequency mixer 940b is configured to receive the second frequency mixer output and a transposition signal 944b as inputs, and generate a third frequency mixer output at a second intermediate frequency. The third frequency output is provided to a second passband filter 910b, having a second passband offset from the first passband. The fourth frequency mixer 942b is configured to receive the second passband filter output and the transposition signal 944b as inputs, for generating a mode selection signal MSS. In an embodiment, mode selection signal MSS has a frequency response including an oscillatory mode of the input signal $RF_{in}$. In an embodiment, the oscillatory mode is based on an overlap passband defined by overlap between the first passband and the second passband. In an embodiment, the first passband overlaps with the second passband, between the first intermediate frequency and the second intermediate frequency.

Figure 10:
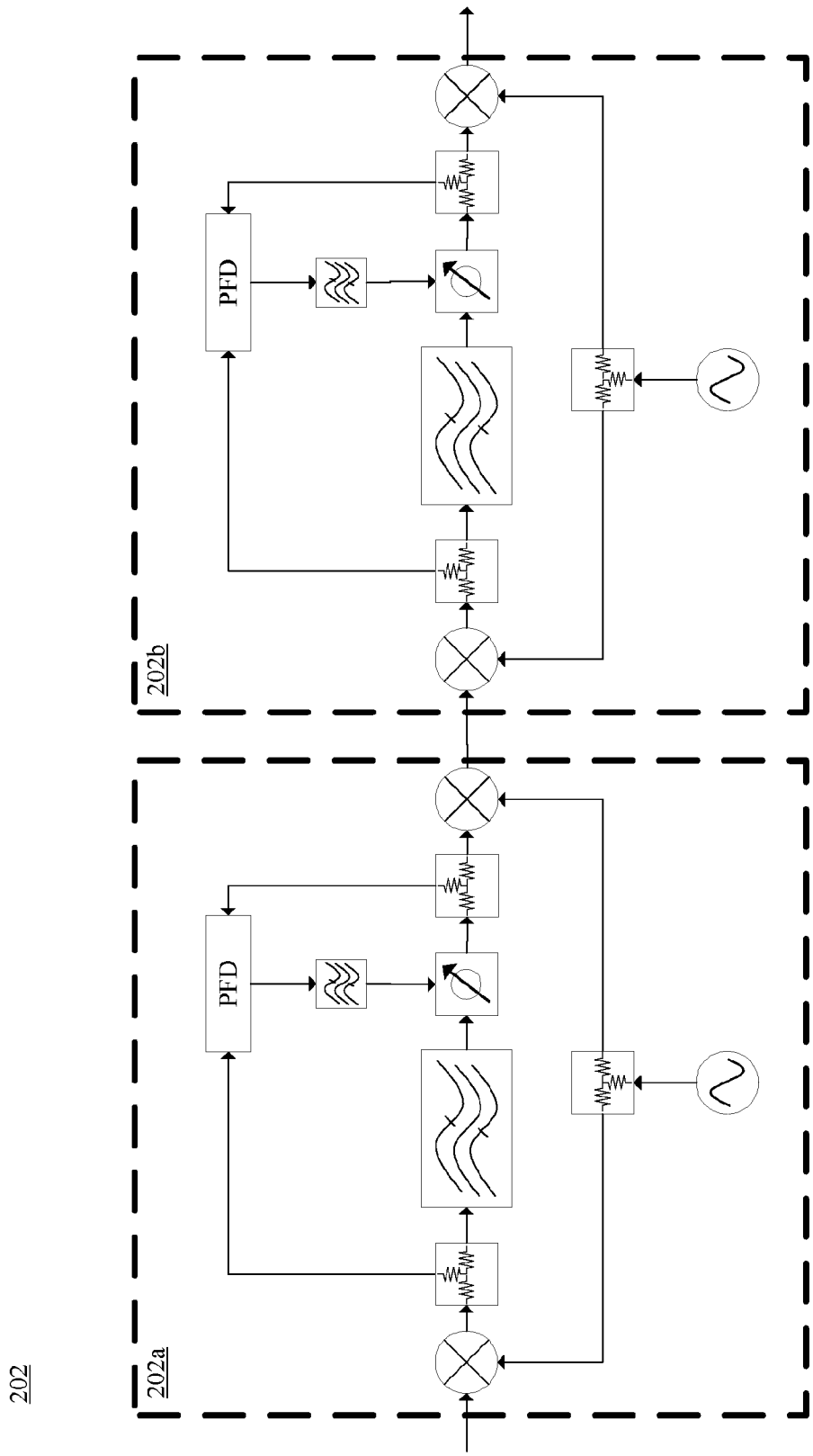
FIG. 10 illustrates the mode selection filter according to FIG. 9, wherein the first and second mode selection filters each include a phase noise suppression loop and a local oscillator.
Figure 11:
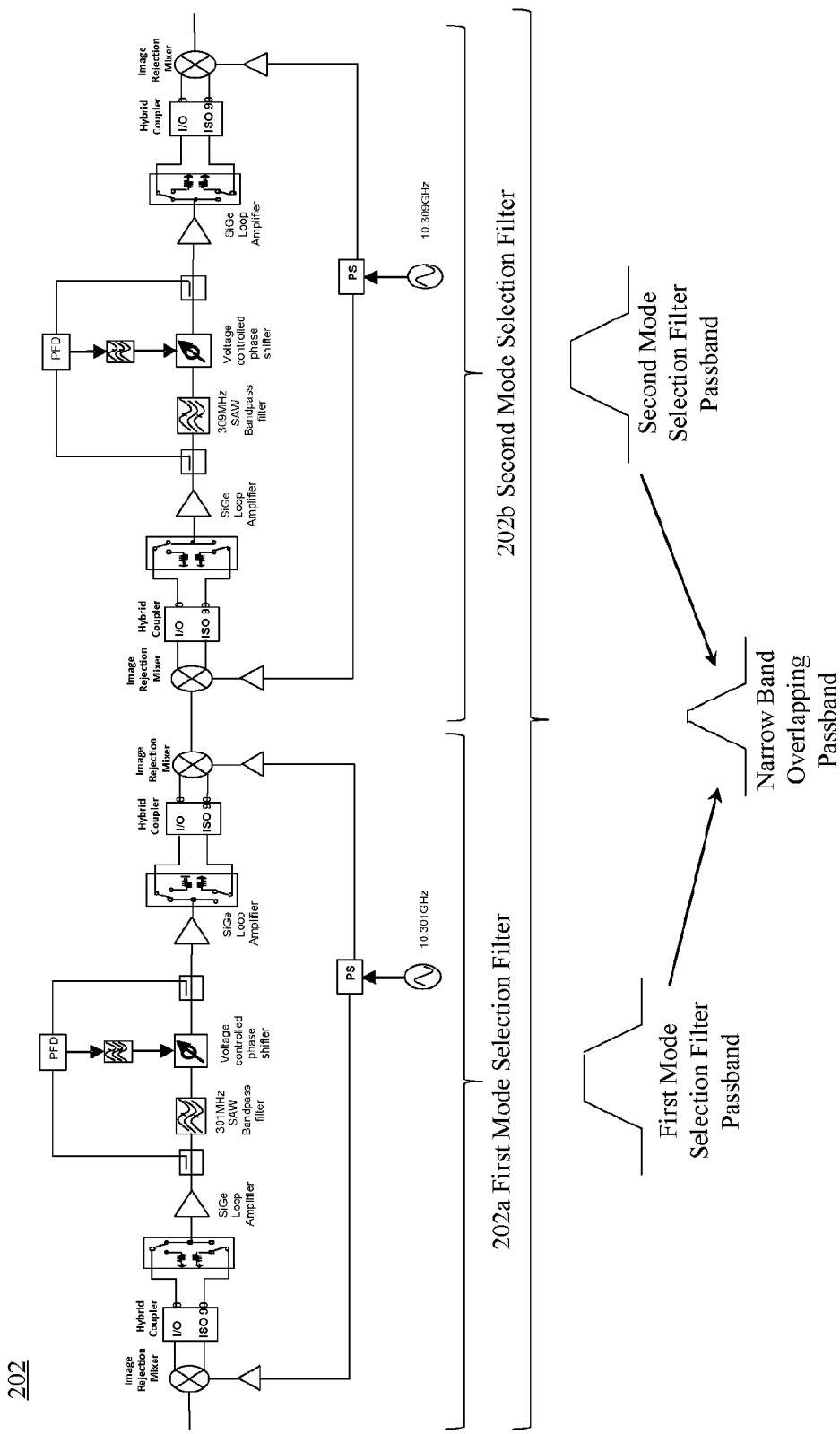
FIG. 11 illustrates the mode selection filter according to FIG. 10, wherein the first and second mode selection filters further comprise a hybrid coupler and a switch, co-operable to select an RF sideband.

FIGS. 10 and 11 illustrate further embodiments of first and second mode selection filters 202a and 202b. In particular, FIG. 10 illustrates an embodiment of first and second mode selection filters 202a and 202b according to FIG. 9, each mode selection filter further comprising a local oscillator, a phase noise suppression loop as disclosed according to an embodiment herein, and a plurality of power splitters. Similarly, FIG. 11 illustrates an embodiment of first and second mode selection filters 202a and 202b according to FIG. 10, each mode selection filter further comprising a hybrid coupler and sideband switch coupled to each image rejection mixer, and a plurality of amplifiers.

Figure 12:
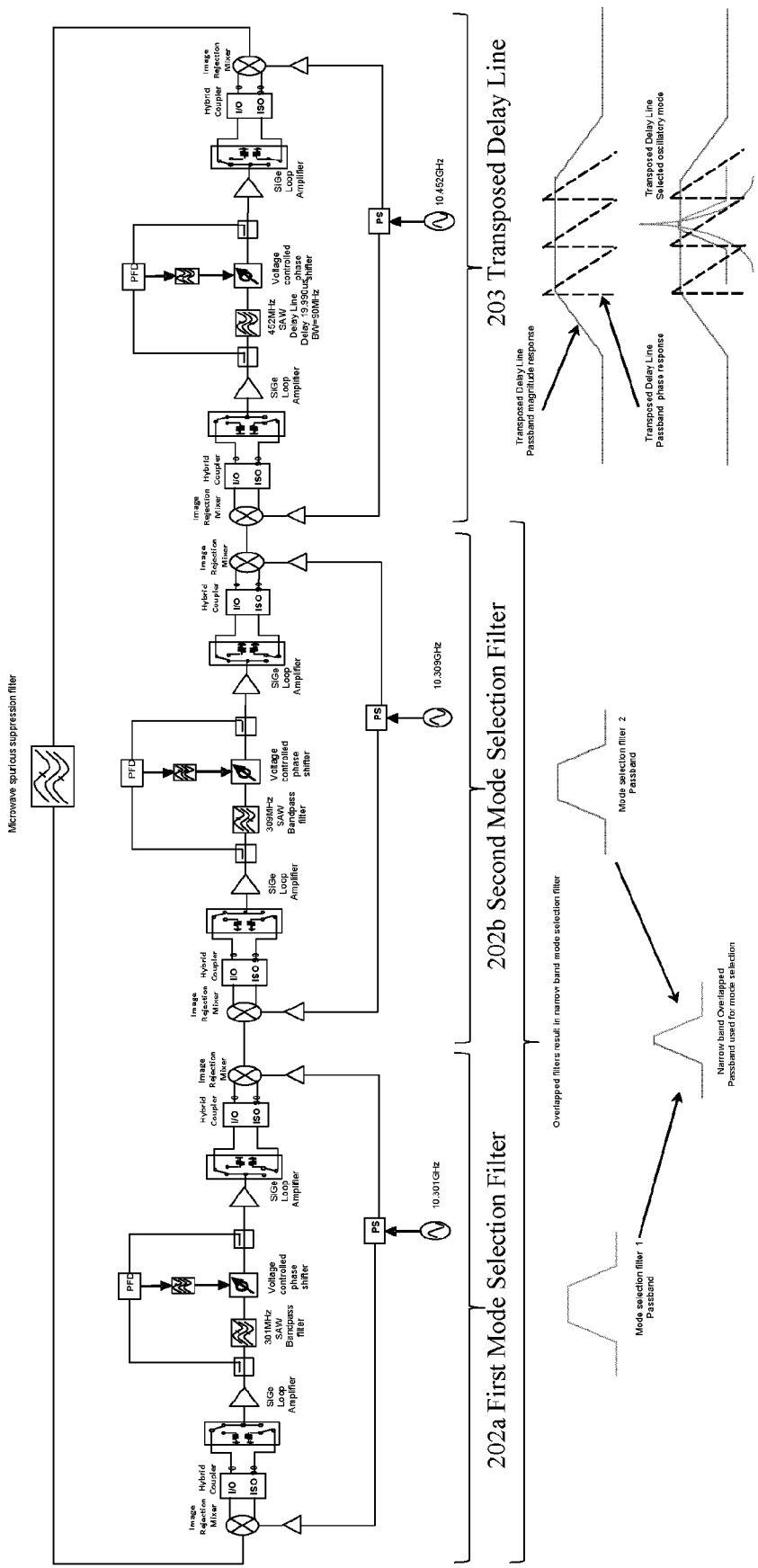
FIG. 12 illustrates a transposed delay line oscillator having an oscillator loop defined by a first and second mode selection filters coupled to a transposed delay line, the transposed delay line oscillator further comprising a microwave spurious suppression filter.

FIG. 12 illustrates a transposed delay line oscillator according to an embodiment disclosed herein. The transposed delay line oscillator comprises first and second mode selection filters 202a and 202b, as similarly depicted in FIG. 11—further coupled to a transposed delay line 203, such as transposed delay line 703 similarly depicted in FIG. 7. The transposed delay line 203 outputs the transposed delay line oscillator output, and is further coupled to an input of first mode selection filter 202a, thereby defining an oscillator loop, such as oscillator loop 205 illustrated in FIG. 2A. In an embodiment, the transposed delay line oscillator further comprises a microwave spurious suppression filter provided in the oscillator loop between an output of the transpose delay line 203 and an input of the first mode selection filter 202a. In an embodiment, the microwave spurious suppression filter is configured to suppress frequency spurs in the output of the transposed delay line 203. In an embodiment, the output from the oscillatory loop is extracted after the microwave spurious suppression filter.

In addition to the foregoing, other aspects of mode selection and mode selection filters as disclosed in Applicant's related U.S. patent application Ser. No. 15/752,797 entitled OPTOELECTRONIC OSCILLATOR WITH TUNABLE FILTER, are herein incorporated by reference.

Figure 13:
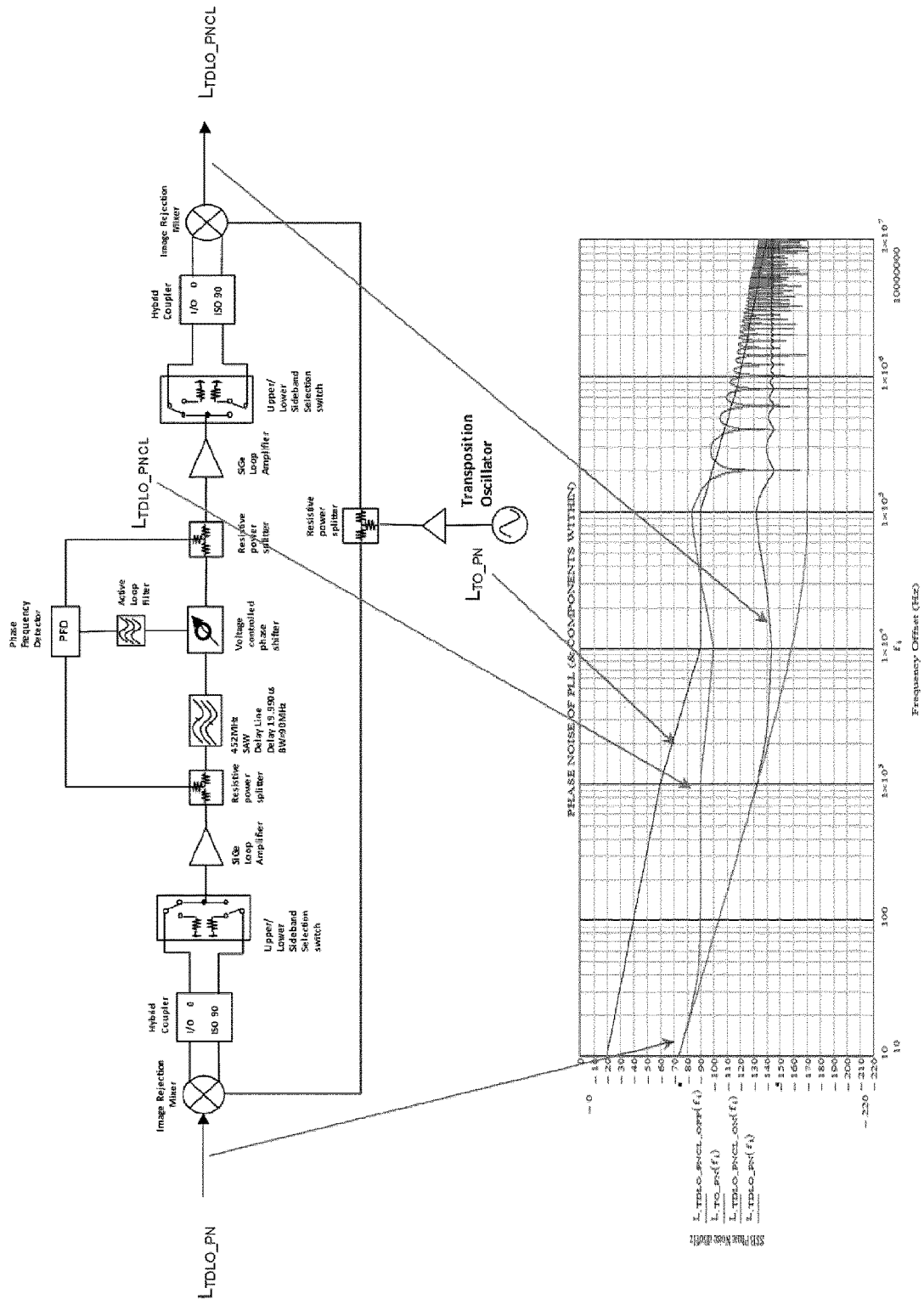
FIG. 13 depicts a transposed delay line and a graph illustrating four plots of phase noise as seen at different locations along the transposed delay line.

FIG. 13 illustrates a transposed delay line, such as transposed delay line 703 similarly depicted in FIG. 7, and a detailed graph illustrating four plots relating to phase noise in: the input signal to the image rejection mixer ($L_{TDLO\_PN}$); the output of the phase noise suppression loop ($L_{TDLO\_PNCL\_OFF}$) the output of the transposed delay line ($L_{TDLO\_PNCL\_ON}$); and, the transposition signal ($L_{TO\_PN}$). In particular, the output of the transposed delay line plot $L_{TDLO\_PNCL\_ON}$ illustrates greater phase noise suppression compared to the output of the transposed delay line plot ($L_{TDLO\_PNCL\_ON}$). The improvement in phase noise is attributable to the phase noise suppression loop suppressing de-correlated phase noise by providing a phase noise suppression loop output matched in phase to the transposition signal phase. In the example embodiment of FIG. 13, at an offset frequency $f_i$ of 1 kHz, the phase noise suppression loop improves phase noise suppression at the output of the transposed delay line by about 40 dB.

Figure 14:
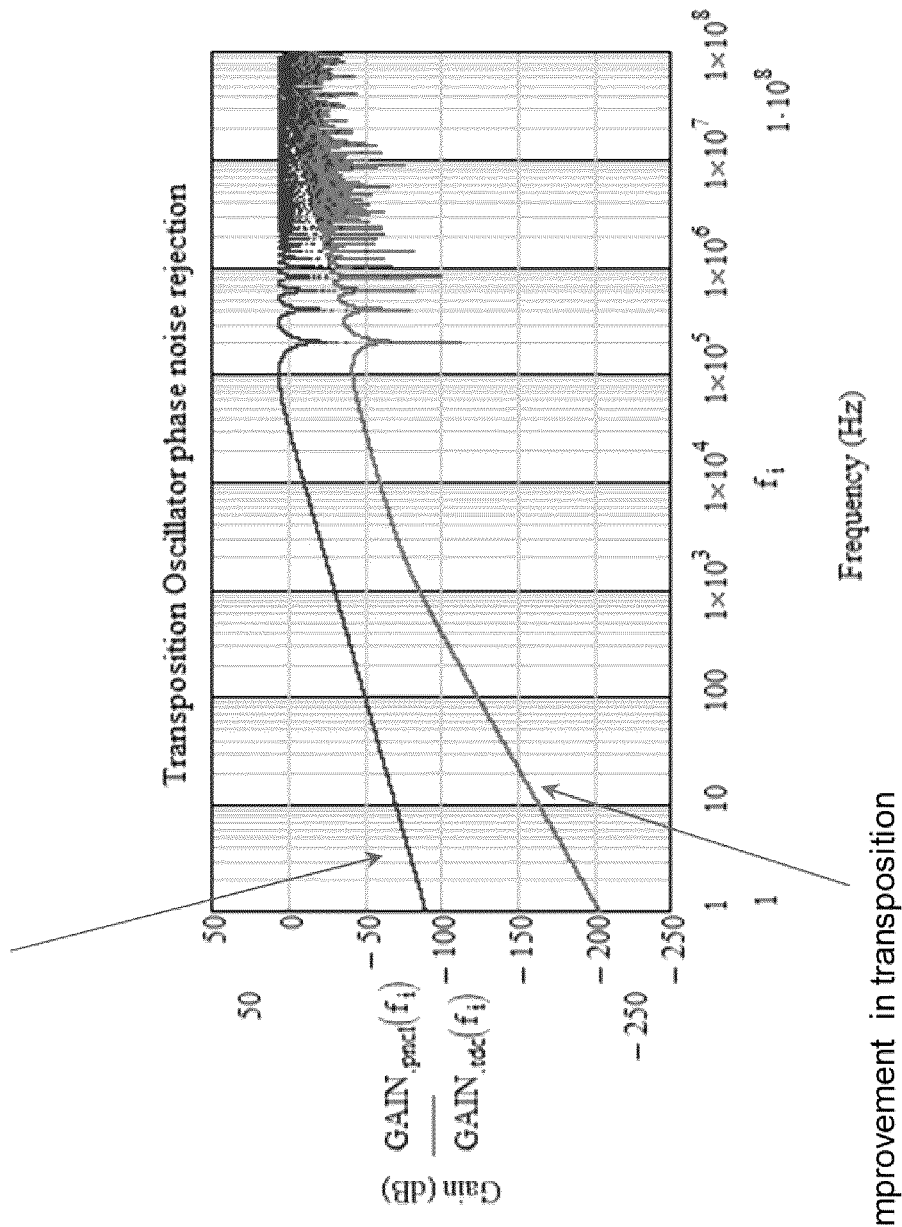
FIG. 14 is a graph illustrating two gain plots showing the transposition oscillator phase noise reduction achieved using a phase noise suppression loop as disclosed herein.

FIG. 14 is a detailed graph illustrating gains in transposition oscillator phase noise rejection. The top plot relates to a transposed delay line oscillator having limited correlation with phase noise, and consequently illustrates comparatively higher gains in phase noise as compared to the bottom plot. The bottom plot relates to a transposed delay line oscillator having a phase noise suppression loop, and consequently illustrates comparatively lower gains in phase noise when compared to the top plot. In the example embodiment of FIG. 14, at an offset frequency $f_i$ of 1 kHz, the bottom plot realizes approximately a −50 dB improvement in phase noise.

Figure 15:
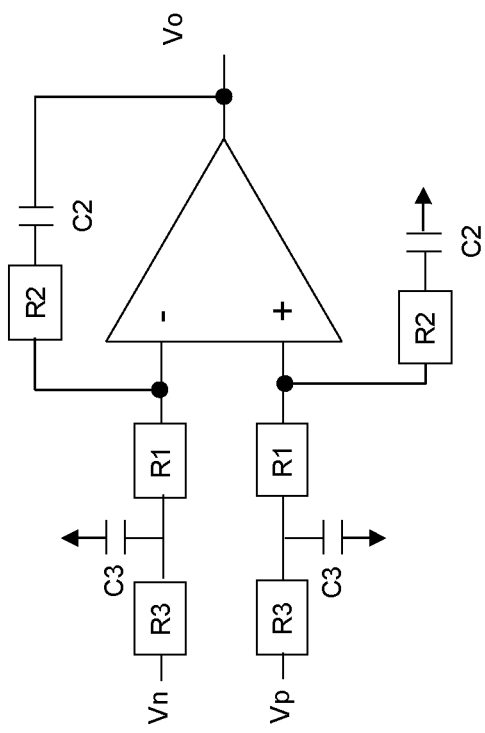
FIG. 15 is a schematic of a phase noise suppression loop filter according to an embodiment disclosed herein.

FIG. 15 illustrates an embodiment of a phase noise suppression loop filter, such as integrator filter 433 as disclosed herein.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. An oscillator, comprising:
   a mode selection filter configured to output a mode selection signal at a frequency in a Radio Frequency (RF) band, the mode selection signal having a frequency response including an oscillatory mode;
   a transposed delay line comprising:
     a first frequency mixer configured to receive, as inputs, the mode selection signal and a transposition signal, and configured to provide a first frequency mixer output at an intermediate frequency;
     an intermediate frequency (IF) delay line comprising:
       a delay filter configured to receive the first frequency mixer output and configured to provide a delay filter output, the delay filter output having a phase de-correlated from a phase of the transposition signal, and
       a phase noise suppression loop configured to receive, as inputs, the first frequency mixer output, the delay filter output, and a previous phase noise suppression loop output, the phase noise suppression loop configured to phase shift the delay filter output to produce a phase noise suppression loop output, the phase shift based on accumulation of a detected phase difference between the first frequency mixer output and the previous phase noise suppression loop output;
     a second frequency mixer configured to receive, as inputs, the phase noise suppression loop output and the transposition signal, and configured to provide an oscillator output in the RF band, the oscillator output being coupled to an input of the mode selection filter.

2. The oscillator of claim 1 wherein the phase noise suppression loop further comprises:
   a phase frequency detector configured to detect the phase difference between the first frequency mixer output and the previous phase noise suppression loop output;
   an integrator configured to accumulate the detected phase difference, and
   a phase shifter configured to phase shift the delay filter output based on the accumulated phase difference, the phase shifter configured to produce the phase noise suppression loop output.

3. The oscillator of claim 1, further comprising:
   a transposition oscillator for generating the transposition signal, and
   a first amplifier and a first power splitter in communication with the transposition oscillator and being co-operable to amplify and split the transposition signal for transmission to each of the first and second frequency mixers.

4. The oscillator of claim 1 wherein:
   the first frequency mixer is an image rejection mixer configure to remove an RF sideband from the first frequency mixer output, and
   the second frequency mixer is an image rejection mixer configured to remove an RF sideband from the oscillator output.

5. The oscillator of claim 4, further comprising:
   a first hybrid coupler and a first sideband switch provided between the first frequency mixer and the delay filter, the first hybrid coupler and the first sideband switch co-operable to enable selection of a lower or upper RF sideband of the first frequency mixer output, and
   a second hybrid coupler and a second sideband switch provided between the phase shifter and the second frequency mixer, the second hybrid coupler and the second sideband switch co-operable to enable selection of a lower or upper RF sideband communicated to the second frequency mixer input.

6. The oscillator of claim 1 further comprising:
   a second amplifier connected between the first frequency mixer and a second power splitter, the second amplifier configured to amplify the first frequency mixer output; the second power splitter configured to couple the first frequency mixer output to the phase noise suppression loop and the delay filter.

7. The oscillator of claim 2, wherein:
   the phase frequency detector and phase shifter are voltage based, and
   the integrator is an integration filter configured to supress a frequency spur of the accumulated detected phase difference, the integration filter configured to provide a DC control voltage to the phase shifter based on the accumulated detected phase difference.

8. The oscillator of claim 1 wherein the delay filter has a time delay and a center frequency between about 1 kHz and about 3 GHz, wherein the intermediate frequency is substantially equal to the delay filter center frequency.

9. The oscillator of claim 1 wherein the delay filter is a bandpass filter having a time delay and a delay filter bandpass, the bandpass based on a delay filter center frequency and a delay filter bandwidth, wherein the intermediate frequency is within the delay filter bandpass.

10. The oscillator of claim 1 wherein the delay filter is a bandpass filter having a time delay, a delay filter center frequency and a delay filter bandwidth between about 20 MHz and about 150 MHz, wherein the intermediate frequency is substantially equal to the delay filter center frequency.

11. The oscillator of claim 8, wherein the time delay of the delay filter is between about 1 microsecond and about 100 microseconds.

12. The oscillator of claim 11, wherein the mode selection filter comprises:
a first bandpass filter configured to receive, as an input, the oscillator output of the transposed delay line, the first bandpass filter having a first bandpass;
a second bandpass filter configured to receive, as an input, the output of the first bandpass filter, the second bandpass filter having a second bandpass overlapping with the first bandpass for co-operably providing an overlapping bandpass configured to isolate a desired oscillatory mode.

13. The oscillator of claim 12 further comprising:
a plurality of frequency mixers and a plurality of transposition oscillators in communication with the first and second bandpass filters, the plurality of frequency mixers and transposition oscillators configured to:
provide to the first bandpass filter, the oscillator output, transposed to a first intermediate frequency;
provide to the second bandpass filter, an output of the first bandpass filter transposed to a second intermediate frequency, and
output the mode selection signal, based on transposing an output of the second bandpass filter to the mode selection signal frequency.

14. The oscillator of claim 13, wherein:
the first bandpass filter has a first center frequency and the first mode intermediate frequency is substantially equal to the first center frequency, and
the second bandpass filter has a second center frequency and the second mode intermediate frequency is substantially equal to the second center frequency.

15. The oscillator of claim 13, wherein the overlap bandpass is between the first mode intermediate frequency and the second mode intermediate frequency.

16. The oscillator of claim 15 wherein the overlap bandpass is based on a reciprocal of the delay filter time delay.

17. The oscillator of claim 12, wherein the first and second bandpass filters are electronically tunable filters (ETF).

18. A method of suppressing phase noise in a transposed delay line oscillator, the method comprising:
generating a mode selection signal at a reference frequency in a Radio Frequency (RF) band, the mode selection signal having a frequency response including an oscillatory mode;
transposing the mode selection signal with a transposition signal to generate a transposed mode selection signal at an intermediate frequency;
delaying the transposed mode selection signal by-based on a time delay to generate a delayed mode selection signal, wherein a phase of the delayed mode selection signal is de-correlated from a phase of the transposition signal;
phase shifting the delayed mode selection signal to generate a phase noise suppressed mode selection signal based on:
detecting a phase difference between the transposed mode selection signal and a previous phase noise suppressed mode selection signal;
generating a new total phase difference based on accumulating the detected phase difference with a previous total phase difference, and
phase shifting the delayed mode selection signal based on the new total phase difference;
transposing the phase noise suppressed mode selection signal with a transposition signal to generate a transposed delay line output at the reference frequency, wherein the transposed delay line output is coupled to a mode selection filter for use in generating the mode selection signal.

19. A method of suppressing phase noise in a transposed delay line, the method comprising:
transposing a Radio Frequency (RF) signal with a transposition signal to generate a transposed mode selection signal at an intermediate frequency;
delaying the transposed RF signal based on a time delay to generate a delayed RF signal, wherein a phase of the delayed RF signal is de-correlated from a phase of the transposition signal;
phase shifting the delayed RF signal to generate a phase noise suppressed RF signal based on:
detecting a phase difference between the transposed mode selection signal and a previous phase noise suppressed RF signal;
generating a new total phase difference based on accumulating the detected phase difference with a previous total phase difference, and
phase shifting the delayed RF signal based on the new total phase difference;
transposing the phase noise suppressed RF signal with a transposition signal to generate a transposed delay line output in an RF band, wherein the RF signal is based on the transposed delay line output.

20. A non-transitory computer readable medium having instructions stored thereon that when executed by a processor, cause the processor to perform the method steps according to claim 19.

* * * * *